(12) United States Patent
Parulkar et al.

(10) Patent No.: US 7,890,826 B2
(45) Date of Patent: Feb. 15, 2011

(54) METHOD AND APPARATUS FOR TEST OF ASYNCHRONOUS PIPELINES

(75) Inventors: Ishwardutt Parulkar, San Francisco, CA (US); Josephus C. Ebergen, San Francisco, CA (US); Ilyas Elkin, Sunnyvale, CA (US)

(73) Assignee: Oracle America, Inc., Redwood City, CA (US)

( * ) Notice: Subject to any disclaimer, the term of this patent is extended or adjusted under 35 U.S.C. 154(b) by 836 days.

(21) Appl. No.: 11/636,748

(22) Filed: Dec. 11, 2006

(65) Prior Publication Data

US 2008/0141088 A1     Jun. 12, 2008

(51) Int. Cl.
*G01R 31/28* (2006.01)
*H03K 19/00* (2006.01)

(52) U.S. Cl. .................. 714/731; 714/726; 714/729; 326/93

(58) Field of Classification Search ............... 714/731, 714/726, 729; 326/93
See application file for complete search history.

(56) References Cited

U.S. PATENT DOCUMENTS

| | | | |
|---|---|---|---|
| 5,406,216 A * | 4/1995 | Millman et al. | ............ 327/202 |
| 5,937,177 A | 8/1999 | Molnar | |
| 6,356,117 B1 * | 3/2002 | Sutherland et al. | ............ 326/93 |
| 6,420,907 B1 | 7/2002 | Sutherland | |
| 6,819,140 B2 * | 11/2004 | Yamanaka et al. | ............ 326/93 |
| 7,065,665 B2 * | 6/2006 | Jacobson et al. | ............ 713/400 |

OTHER PUBLICATIONS

King et al., Testing Micropipelined Asynchronous Circuits, 2004, IEEE, Paper 12.1, pp. 329-338.*
Kapoor, Formal Modelling and Verification of an Asynchronous DLX Pipeline, IEEE, 2006, pp. 1-10.*
Li et al., Asynchronous Datapath with Software-Controlled On-Chip Adaptive Voltage Scaling for Multirate Signal Processing Applications, IEEE, 2003, pp. 1-10.*

* cited by examiner

*Primary Examiner*—John J Tabone, Jr.
(74) *Attorney, Agent, or Firm*—Meyertons, Hood, Kivlin, Kowert & Goetzel, P.C.; Erik A. Heter (57) ABSTRACT

A method and apparatus for test of asynchronous pipelines. An asynchronous data pipeline includes first and second pluralities of pipeline stages in an alternating sequence. Each of the pipeline stages includes a control circuit, a latch circuit configured to latch data responsive to an indication from the control circuit, and a combinational logic circuit coupled to receive data from an output of the latch circuit. Each of the latch circuits is scannable. The latch circuits of the first and second pluralities of pipeline stages form a data scan chain configured to load test data into the combinational logic circuits during testing of the data pipeline. The data pipeline further includes a control scan chain configured to load control data for operating the control circuits during testing of the data pipeline. Testing of the data pipeline can include independent testing of the control portion or the data portion.

16 Claims, 6 Drawing Sheets

METHOD AND APPARATUS FOR TEST OF ASYNCHRONOUS PIPELINES

BACKGROUND OF THE INVENTION

1. Field of the Invention

This invention relates to electronic circuits, and more particularly, to the test and debug of asynchronous pipelines used to convey information in electronic circuits.

2. Description of the Related Art

Many modern digital circuits are synchronous circuits. Synchronous digital circuits typically include storage elements such as flip-flops or latches that move data based on the edge (or edges) of a reference clock signal.

More recently, the use of asynchronous (i.e. clockless) circuits has increased. Asynchronous circuits may enable much faster operating speeds, and may also allow for reduced power consumption and reduced electromagnetic radiation due to the lack of a reference clock signal. Instead of relying on a reference clock, asynchronous circuits may be implemented as data pipelines and rely on local coordination control circuits to ensure an orderly flow through the pipelines.

Figure 1:
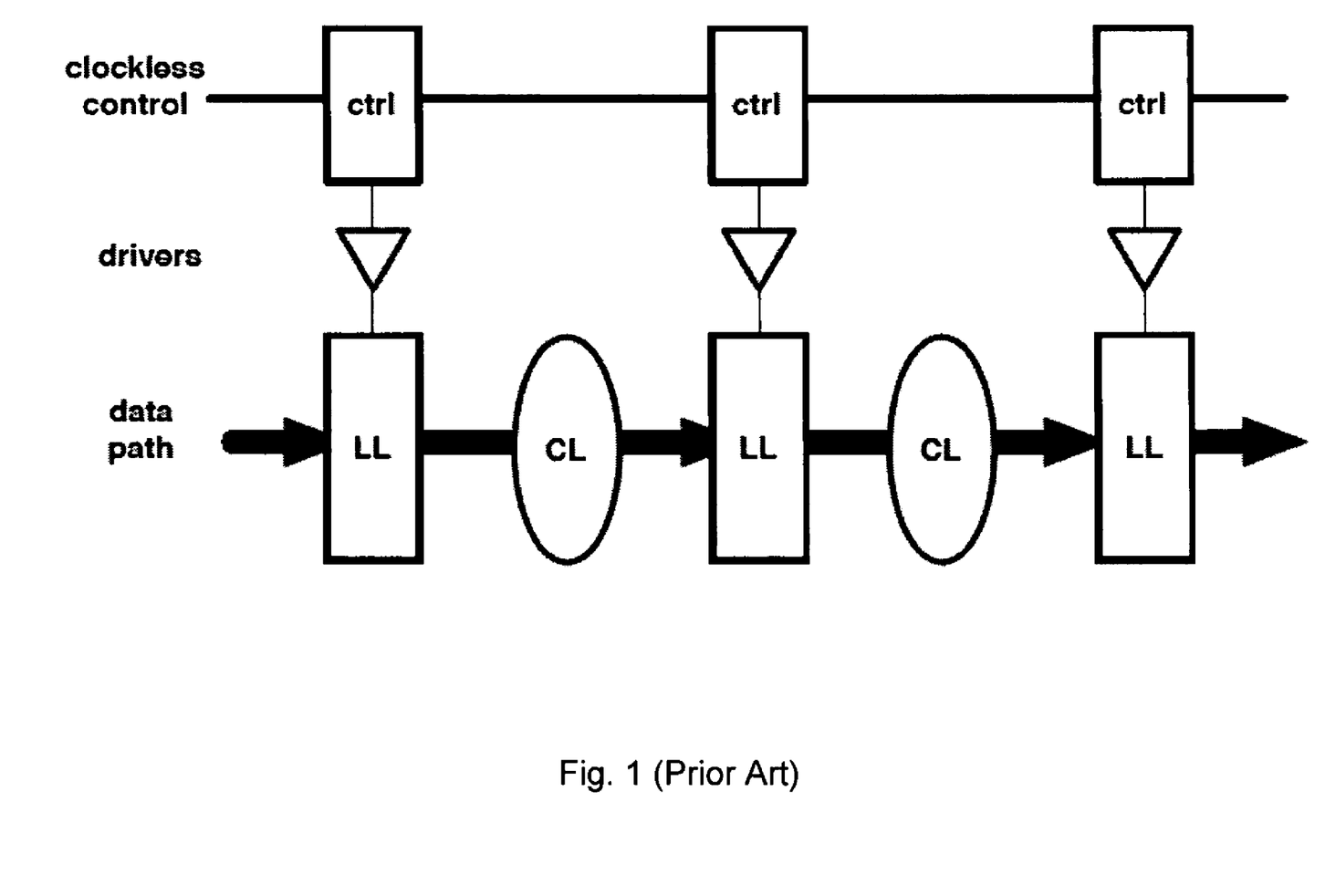
FIG. 1 (Prior Art) is a block diagram of one embodiment of a clockless pipeline.

FIG. 1 is a block diagram of one embodiment of a clockless pipeline. In the embodiment shown, the clockless pipeline includes a plurality of control circuits ('ctrl') coupled to each other by a signal line for conveying clockless control signals. Each control circuit is coupled to a respective latch logic circuit ('LL') via a driver. Combinational logic circuits ('CL') are coupled between the latch logic circuits. A data path extends through latch logic and combinational logic circuits.

The control circuits in the embodiment of FIG. 1 are configured to exchange control signals with each other. When a given stage is ready to receive data, its respective control circuit sends an acknowledgement signal to the control circuit of the previous pipeline stage indicating that the stage is empty and ready to receive data. If data is present in the previous pipeline stage, a request signal is sent back to the originating control circuit. Responsive to receiving this request signal, the control circuit drives a signal to the latch logic (via the driver), which causes data to be latched in and allows it to propagate to the combinational logic. This effectively provides a local clock pulse or strobe to the latch logic, and this pulse is active only when required to latch data.

After latching the data to the combinational logic, the control circuit of the given stage will remain idle until it receives a signal from the control circuit of the next stage indicating that the next stage is ready to receive data. Responsive to receiving this signal, a request signal is sent to the next stage control circuit and data is latched into the next stage responsive thereto.

In summary, data can be latched to a next stage in the pipeline when there is valid data in front of the next stage latch logic, and when the next stage is empty. If the next stage is not empty, the pipeline will stall until such time as the next stage becomes empty and can thus receive data. The control circuits of the pipeline work together in the described manner to coordinate the movement of data from one stage to another without the need for a reference clock signal.

While many synchronous circuits can be tested by applying test patterns and unloading test response data via scan chains, traditional scan-based testing cannot be applied to asynchronous circuits. In order to test clockless pipelines such as that described above, the various circuits must be modified. The added circuitry may include extra latches and multiplexers and may consume a significant amount of circuit area, and can also cause greater power consumption.

SUMMARY OF THE INVENTION

A method and apparatus for test of asynchronous pipelines is disclosed. In one embodiment, an asynchronous data pipeline includes first and second pluralities of pipeline stages in an alternating sequence. Each of the pipeline stages includes a control circuit, a latch circuit configured to latch data responsive to an indication from the control circuit, and a combinational logic circuit coupled to receive data from an output of the latch circuit. Each of the latch circuits is scannable. The latch circuits of the first and second pluralities of pipeline stages form a data scan chain configured to load test data into the combinational logic circuits during testing of the data pipeline. The data pipeline further includes a control scan chain configured to load control data for operating the control circuits during testing of the data pipeline. Testing of the data pipeline can include independent testing of the control portion or the data portion.

A method for testing the asynchronous data pipeline includes scanning control data into the pipeline via the control scan chain and scanning test data into the pipeline via the data scan chain. Testing the control circuits includes enabling selected ones of the control circuits and subsequently scanning out successor states of the control circuits via the control scan chain. Testing the latch and combinational circuits includes scanning test data in through the data scan chain, latching the data, capturing test result data from the combinational logic circuits, and scanning out the test result data.

As previously noted, the data pipeline includes a first plurality of stages and a second plurality of stages arranged in an alternating sequence. That is, the data pipeline comprises a stage of the first plurality, followed by a stage of the second plurality, followed by another stage of the first plurality, and so forth. The control circuits of each of the first plurality of stages are coupled to receive a first enable signal, while the control circuits of the second plurality of stages are coupled to receive a second enable signal. Testing of the control circuits as well as the latch and combinational circuits may include selectively enabling control circuits of the first or second pluralities of stages such that data is latched and captured. Once captured, data can then be shifted out through the data scan chain in order to verify the operation of either the control circuits or the latch and combinational circuits, depending on which is being tested. Successor states of the control circuits may also be scanned out via the control scan chain during the testing of the control circuits. Testing may be repeated for a number of different patterns of control data or test data to fully exercise the control circuits, the latch circuits, and the combinational logic circuits.

BRIEF DESCRIPTION OF THE DRAWINGS

Other aspects of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Figure 2A:
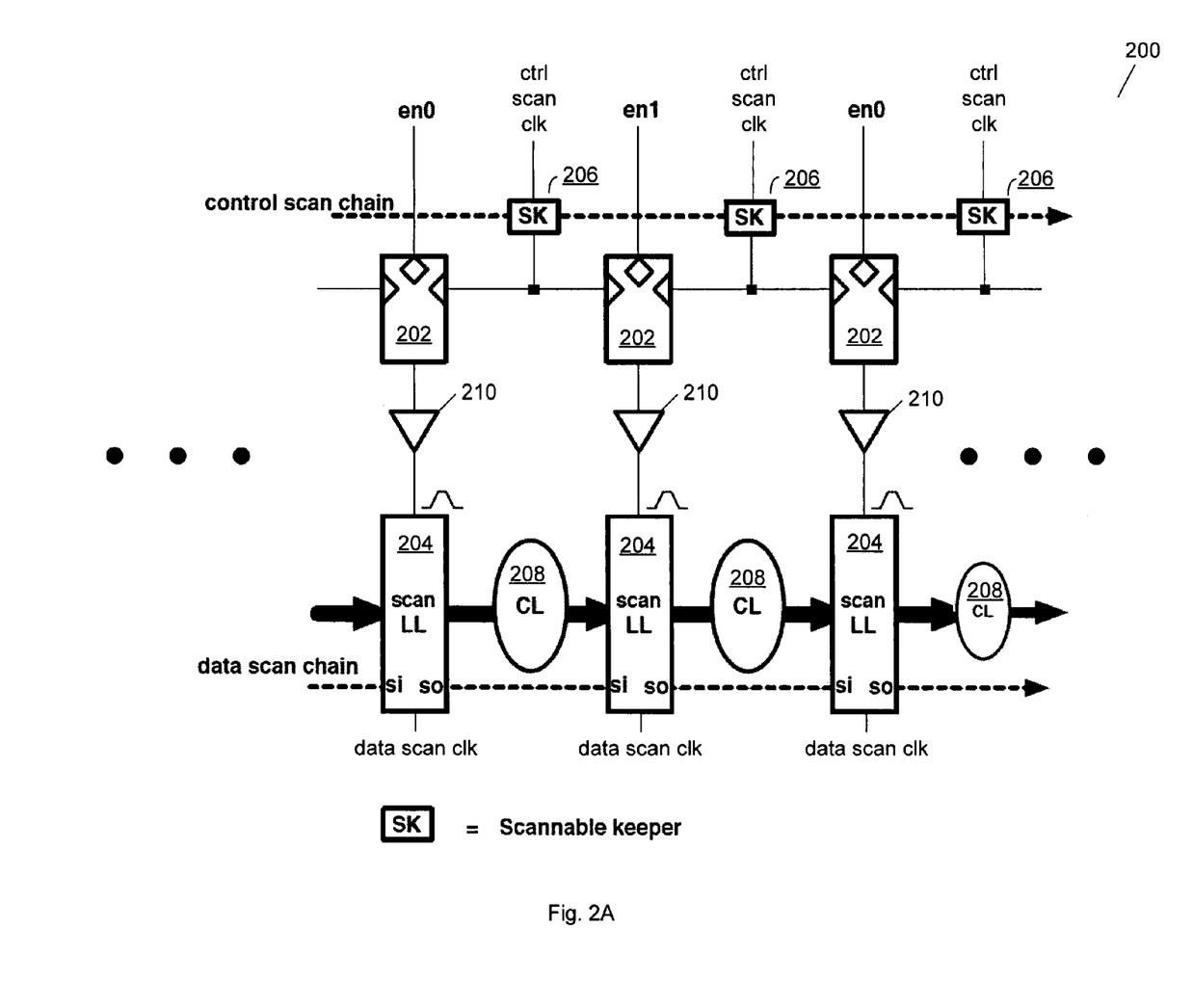
FIG. 2A is a block diagram of one embodiment of a clockless pipeline having a control scan chain and a data scan chain.

Turning now to FIG. 2A, a block diagram of one embodiment of a clockless pipeline having a control scan chain and a data scan chain is shown. In the embodiment shown, asynchronous data pipeline 200 includes a plurality of stages coupled together in a sequence. In this particular example, only three stages are shown for the sake of simplicity. However, it is to be understood that there may be any number of stages, which is limited only by the design of the circuit in which the asynchronous data pipeline is to be implemented (typically, one or more integrated circuits).

Each of the stages includes a control circuit 202, which is coupled to a latch circuit 204 via a driver 210. Each control circuit 202 is configured to provide a pulse to its corresponding latch circuit 204 in order to cause data to be latched. When data is latched by a latch circuit 204, it propagates to a combinational logic circuit 208. Each combinational logic circuit 208 may include one or more various types of combinational logic circuits, including logic gates such as AND, OR, NAND, NOR, XOR, and the like, and various combinations thereof. The data provided to each combinational logic circuit 208 propagates through these various gates and may thus result in new data present at the input of a latch circuit 204 of the next stage.

Figure 2B:
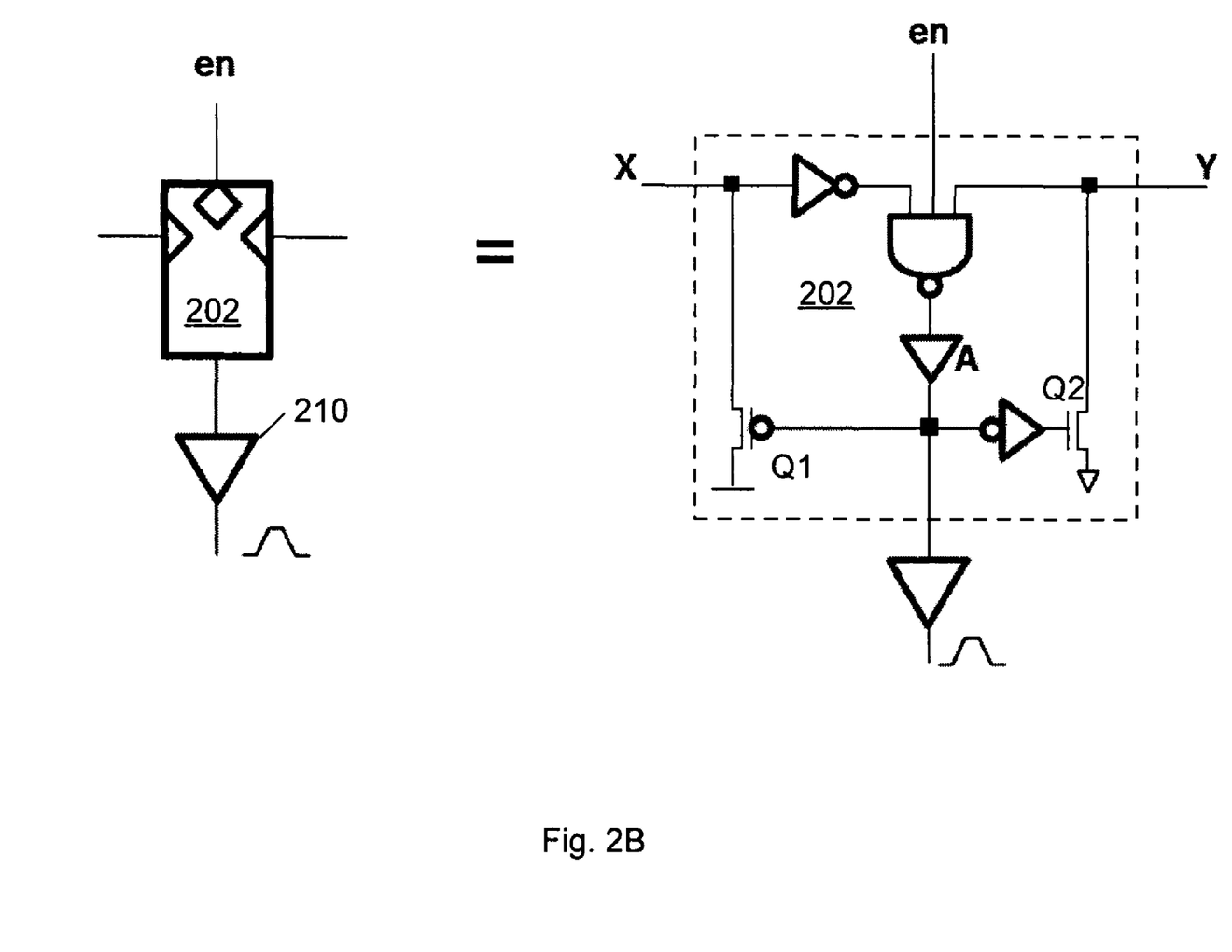
FIG. 2B is a circuit diagram illustrating a control circuit used in the clockless pipeline of FIG. 2A.

FIG. 2B is a circuit diagram illustrating a control circuit used in the clockless pipeline of FIG. 2A. In the embodiment shown, the input/output X of control circuit 202 is coupled to a control circuit of a preceding pipeline stage, while the input/output Y is coupled to a succeeding stage. When a latch pulse (from the output of the NAND gate via driver A) is low, transistors Q1 and Q2 are both turned on. This results in the X input/output being pulled up to a logic high (through Q1) while the Y input/output is pulled low. When the latch pulse is high, transistors Q1 and Q2 are both turned off. When transistor Q1 is off, the state of the X input/output may remain high until pulled low by a control circuit 202 from the preceding stage (more particularly, by a transistor Q2 of the preceding stage control circuit). Similarly, when transistor Q2 is turned off, the state of the Y input/output may remain low until pulled high by the succeeding stage control circuit (i.e. when Q1 of the succeeding stage control circuit is turned on).

Returning to FIG. 2A, the control circuits 202 are coupled to each other by a single signal line. The state of the signal line coupling two control circuits 202 is held by a keeper circuit (scannable keepers 206 as shown.). The keeper circuit may be implemented to include two back-to-back inverters. The keepers 206 are configured to hold the state of their respective signal line even in the presence of leakage from the transistors of the control circuits 202. However, the state of a given signal line may be changed by one of the control circuits 202 when a corresponding transistor (Q1 or Q2, as discussed above) is turned on.

The arrival of data at the input of a latch 204 for a given stage is indicated to its corresponding control circuit 202 by a request signal from the control circuit of the previous stage. The emptiness (i.e. the ability to receive data) of the current stage is indicated by an acknowledge signal from the succeeding stage, indicating that the succeeding stage has latched data. When these two conditions are met—data is present at the input of the latch of the current stage, and the succeeding stage has latched data, thereby leaving the current stage empty—the control circuit 202 of the present stage is configured to assert a pulse that is conveyed to its corresponding latch 204. The corresponding latch 204 then becomes transparent for a brief time, allowing the data at its input to be latched into the present stage.

In this manner, the control circuits 202 of the various stages of the pipeline are able to control the flow of data without the need for a continuously running reference clock signal. By configuring control circuits 202 to communicate with the control circuits 202 of the preceding and succeeding stages of the pipeline, latch pulses are only asserted when data is available to be latched and there is space in which to move the data.

Figure 3:
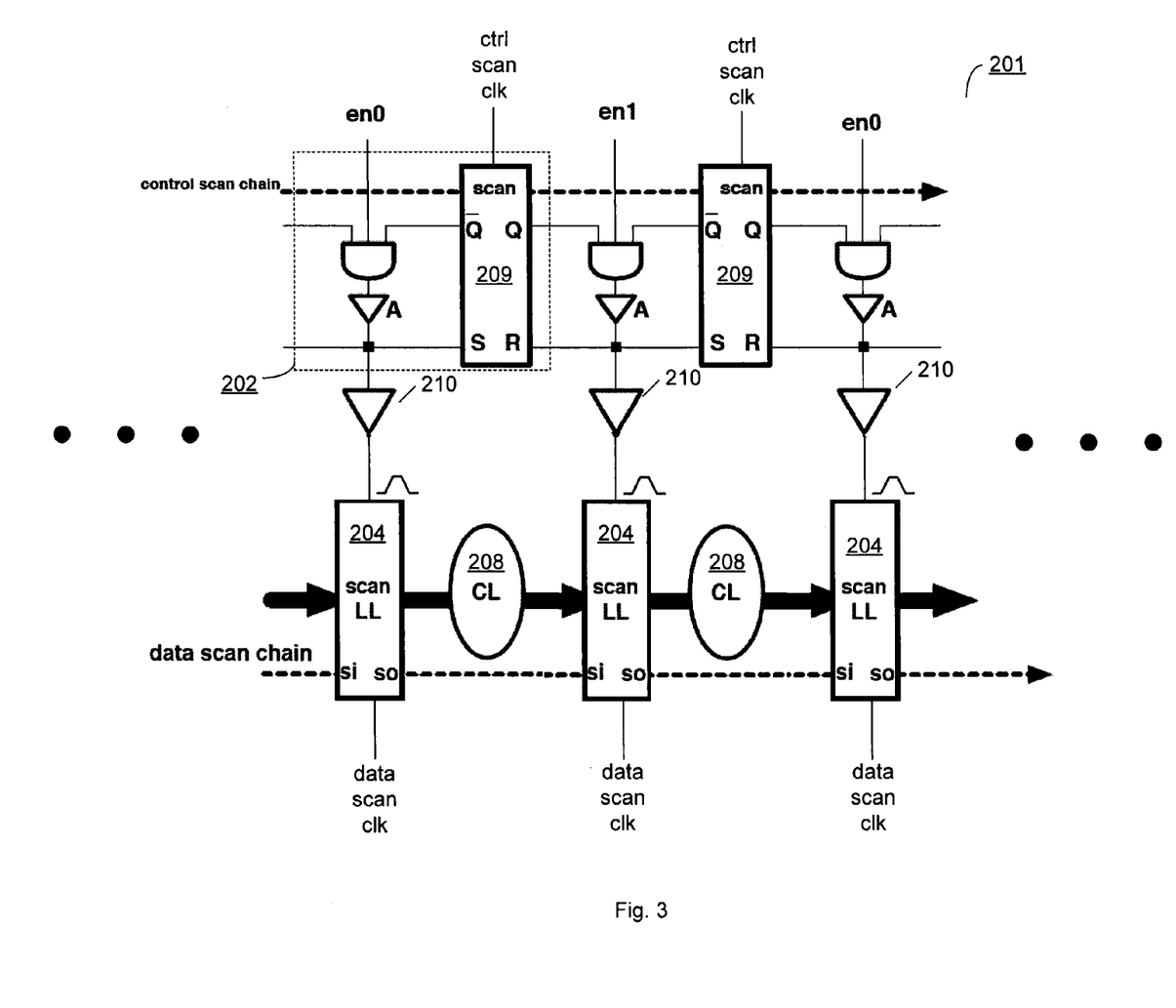
FIG. 3 is a block diagram of another embodiment of a clockless pipeline having a control scan chain and a data scan chain.

It should be noted that the embodiment shown in FIG. 3 is configured to function in a similar manner. In the asynchronous data pipeline 201 of FIG. 3, there are two signal lines coupling each control circuit 202. Each control circuit 202 of the embodiment shown in FIG. 3 includes a set-reset (SR) latch which is used to hold the state of the signal lines. A control circuit 202 of the embodiment shown in FIG. 3 is configured (when enabled) to assert the latch pulse signal when its SR latch 209 is in a reset state while the SR latch 209 of the preceding pipeline stage is in a set state. After a control circuit 202 asserts a latch pulse (causing its corresponding latch 204 to latch data), it sets its own SR latch 209 while resetting the SR latch in the control circuit 202 of the preceding pipeline stage.

Both embodiments of an asynchronous data pipeline (200 in FIG. 2A, 201 in FIG. 3) include both a control scan chain and a data scan chain. Control data for setting the various control circuits 202 may be scanned in through the control scan chain, while test data vectors for testing the latches 204 and the combinational logic circuits 208 may be scanned in through the data scan chain. Since the control scan chain and the data scan chain are synchronized to separate scan clocks, they may be operated independently of one another.

In both the pipelines of FIG. 2A and FIG. 3, the data scan chain is formed by utilizing scannable latches in order to implement latch circuits 204. The scannable latch circuits 204 each include a scan data input (si), a scan data output (so), and a data scan clock input (data scan clk). Data scan chains may also be implemented using other types of scannable latches that are also configured for latching data through the pipeline stages as discussed above. Data may be scanned into the pipeline through the data scan chain and loaded through a latch circuit 204 into a corresponding combinational logic circuit 208. Test result data may also be captured by a latch circuit 204 from the output of a preceding combinational logic circuit, after which it is conveyed to the data scan chain via the scan data output and may subsequently be shifted out for analysis by a test system or the like.

In the embodiment shown in FIG. 2A, the control scan chain is formed by coupling together scannable keepers 206. As previously noted, scannable keepers 206 may each include a pair of inverters coupled back to back in order to keep a signal line coupling two control circuits 202 in a predetermined state. Furthermore, scannable keepers 206 may also include scan circuitry similar to the scan circuitry that allows control data to be scanned into the data pipeline in order to set the control circuits to a predetermined state by setting the signals line coupling them to each other. Each of the scannable keepers 206 is configured to receive a control scan clock signal (ctrl scan clk) which is used to synchronize the control data during scan operations.

A different approach is taken to implementing the control scan chain in the embodiment of FIG. 3. In the embodiment of FIG. 3, a scannable set-reset (SR) latch 209 is included in each of the control circuits. Control data can be scanned into each of the SR latches 209, and each may be put into a set state (Q high, Q-bar low) or a reset state (Q low, Q-bar high). As with the scannable keepers 206 of FIG. 2A, each of the SR latches 209 is coupled to receive a control scan clock signal in order to synchronize the control data during scan operations.

The control scan chains of each embodiment may be used to scan in various control data patterns in order to exercise the control circuits 202 and thus verify their functionality. More particularly, the control scan chains allow the inputs to the control circuits 202 to be set to various states and in different combinations in order to ensure their proper functioning or to detect malfunctions. The control scan chains may also be used to scan out successor states of the control circuits during testing.

In both the embodiments of FIG. 2A and FIG. 3, control circuits 202 of each of the pipeline stages are configured to receive one of a first or second enable signal. In both embodiments, pipeline stages having control circuits 202 coupled to receive the en0 enable signal are placed in an alternating sequence with pipeline stages having control circuits 202 coupled to receive the en1 enable signal. As such, the asynchronous data pipeline of each embodiment may be thought of as including a first plurality of pipeline stages in an alternating sequence with a second plurality of pipeline stages.

During normal operations, both the en0 and en1 circuits may be asserted, thereby enabling each of the control circuits of the data pipeline. During scan operations, both the en0 and en1 may be de-asserted in order to prevent any control circuit 202 from asserting its latch pulse and thus causing data to be latched by a corresponding latch circuit 204. During test operations, the en0 and en1 signals may be selectively asserted depending on the test. For example, in one type of test the en0 signal may be asserted to allow data to be latched by corresponding latch circuits 204, followed by the assertion of the en1 signal and subsequent latching. After the two latching operations, test result data may be captured by the latches 204 and scanned out for analysis.

Figure 4A:
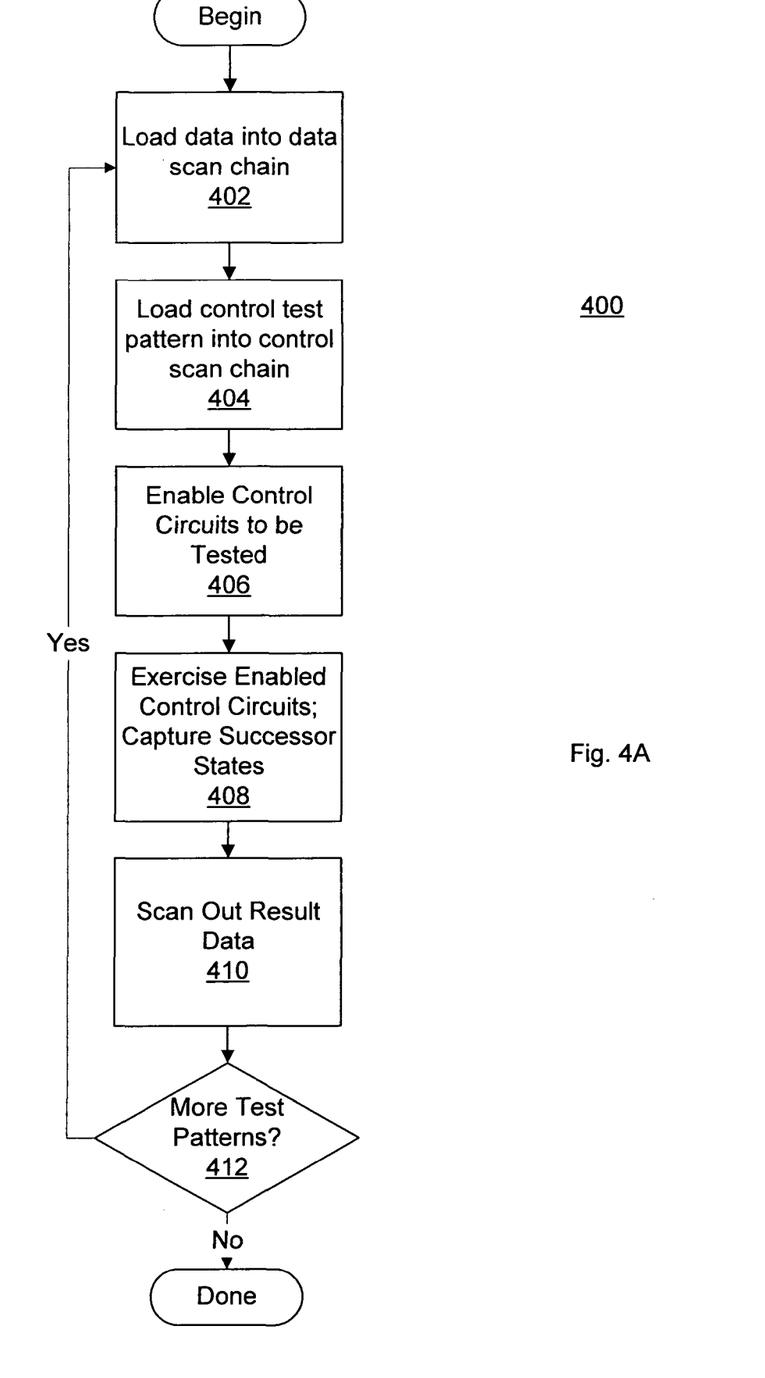
FIG. 4A is a flow diagram illustrating one embodiment of a method for testing a control scan chain.
Figure 4B:
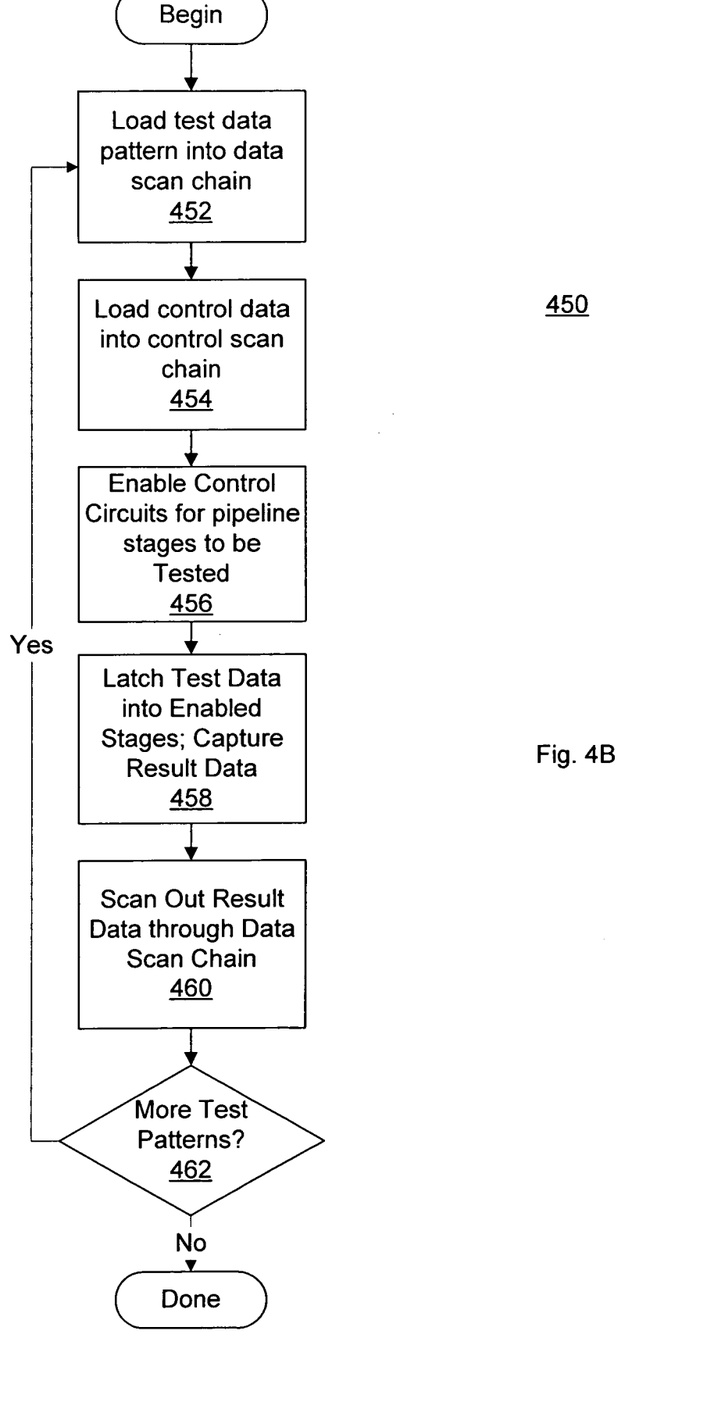
FIG. 4B is a flow diagram illustrating one embodiment of a method for testing a data scan chain.

Testing of the pipeline may be further explained in conjunction with FIGS. 4A and 4B. FIG. 4A is a flow diagram illustrating one embodiment of a method for testing a control scan chain. Method 400 begins with the loading of test data into the data scan chain (402). The data may be data that is provided to selected ones of the pipeline stages or to all of the pipeline stages, and is used mainly to determine whether a control circuit functioned properly by latching or not latching data depending on its inputs. The method also includes loading a control test pattern into the control scan chain (404). This may be performed concurrently with the scanning of data into the data scan chain, or may also be performed before or after. The control data is used to set the inputs to various states for the control circuits to be tested. In some cases, the inputs may be set such that selected control circuits latch data when enabled. In other cases, the inputs may be set such that the selected control circuits do not latch data when enabled.

Once control data has been loaded and scanned in through the control scan chain and test data has been loaded and scanned in through the data scan chain, the control circuits to be tested may be enabled (406). Testing may include selectively enabling control circuits of the first or second plurality of pipeline stages, enabling all of the control circuits, or sequentially enabling control circuits of the first and second pluralities.

After enabling the control circuits, the test continues by exercising the enabled control circuits and capturing their successor states, i.e. the state of control circuits subsequent to their enabling (408). The states of the various signal lines coupling the control circuits (and thus the states of the control circuits themselves) may be captured by the elements of the control scan chain, in order to determine whether certain signals (e.g., request or acknowledge) were asserted responsive to latching data.

Depending on the control data loaded via the control scan chain, some control circuits may assert a latch pulse (assuming they are functioning correctly). Control data may also be loaded for some control circuits such that their inputs should prevent them from asserting the latch pulse when enabled, as the inputs are set such that the conditions (as noted above) for asserting the latch pulse are not met. Thus, control data can be provided to verify whether or not control circuits assert the latch pulse when the appropriate conditions are met as well as whether or not they inhibit assertion of the latch pulse when the appropriate conditions are not met. Tests may also be configured to allow data to be latched through several stages before coming to a stage in which data is stalled in order to verify whether data can move through the pipeline as designed and also whether the pipeline prevents further data movement into a stage in which a stall has occurred. Broadly speaking, tests can be designed to fully exercise the control circuits of the data pipeline to verify whether they move data when indicated, block the movement of data when indicated, allow movement of data up to a stalled pipeline stage, and resume movement of data through an affected stage when the stall is cleared.

Following the exercising of the enabled control circuits in accordance with the control data that was scanned in and the test algorithm utilized, successor states captured. Capturing successor states comprises capturing the states of signal lines coupling control circuits, and thus the states of the control circuits themselves. Captured successor states are then scanned out through the control scan chain (410). In one example, successor states may be scanned out from an integrated circuit or other electronic system in which the data pipeline is implemented, and into a test system, wherein the result data may be analyzed to determine whether or not the test passed or failed.

In addition to capturing successor states, testing of the control circuits may also comprise capturing subsequent states of the combinational logic circuits in order to determine whether data was actually latched (or prevented therefrom) in accordance with the loaded control data and expected results. The subsequent states of the combinational logic circuits may then be captured and scanned out by the data scan chain. This may be performed concurrently with the capturing and scanning of successor states in the control circuits.

Since the fully exercising the control circuits may require more than one control test pattern, the method may be repeated (412, Yes). The method may be repeated for any number of control data patterns in order to ensure an adequate test. If testing of the control circuits is finished (412), the method is then completed.

Turning now to FIG. 4B, a flow diagram illustrating one embodiment of a method for testing a data scan chain is shown. Method 450 is similar to method 400, although the focus of the former is testing of the latch circuits and combinational logic circuits. The method begins with the loading of a test data pattern into the pipeline through the data scan chain (452). Control data may be loaded via the control scan chain (454) either concurrently with the test data, prior to loading the test data, or subsequent to loading the test data. After both test data and control data has been loaded, the control circuits of the pipeline stages to be tested are enabled (456). As with the testing of the control circuits, the enabled stages may be of the first plurality, the second plurality, or both, and further, the stages may be enabled in alternating sequences.

With the control circuits of the stages to be tested enabled, data may then be latched and the result data captured by a succeeding latch (458). After capturing the result data, it may be output through the data scan chain for analysis to determine the test results.

The method may be repeated for a number of test patterns (462, yes). The various test patterns used may be designed to fully exercise the functionality of the latch circuits and the combinational logic circuits. As such, there may be wide variations in the test data patterns applied to the latch and combinational logic circuits during testing. Control data patterns may also be varied to the degree necessary to ensure that the latch and combinational logic circuits are fully exercised during testing.

After the full battery of test and control data patterns has been applied, testing may be completed (462, no).

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. An asynchronous data pipeline comprising:
   a first plurality of pipeline stages and a second plurality of pipeline stages in alternating sequence with the first plurality of pipeline stages, wherein each of the stages includes:
      a control circuit, wherein the control circuits of the first plurality of the pipeline stages are each coupled to receive a first enable signal, and wherein the control circuits of the second plurality of pipeline stages are each coupled to receive a second enable signal;
      a latch circuit configured to latch data responsive to a pulse signal received from an output of the control circuit; and
      a combinational logic circuit coupled to receive data from an output of the latch circuit;
   wherein each of the latch circuits is scannable and, wherein the latch circuits of the first and second plurality of pipeline stages form a data scan chain configured to load test data into the combinational logic circuits during testing of the asynchronous data pipeline; and
   wherein the asynchronous data pipeline further includes a control scan chain configured to load control data for operating the control circuits during said testing of the data pipeline, wherein the control scan chain comprises a plurality of scannable keeper circuits each configured to hold a state of a signal line coupling corresponding adjacent ones of the control circuits, wherein control circuits of adjacent pipeline stages are coupled to communicate with each other over a single signal line.

2. The asynchronous data pipeline as recited in claim 1, wherein one or more of the control circuits in the pipeline is coupled to receive:
   a request signal from a control circuit of a predecessor pipeline stage, the request signal indicating a request to latch data;
   an acknowledgment signal from a control circuit of a successor pipeline stage, the acknowledgement signal indicating that data has been latched in the successor pipeline stage;
   wherein each of the one or more control circuits is configured to assert a latch pulse responsive to concurrently receiving an asserted request signal and an asserted acknowledgement signal.

3. The asynchronous data pipeline as recited in claim 2, wherein each latch circuit is configured to latch data into a present pipeline stage responsive to receiving an asserted latch pulse from a corresponding one of the one or more control circuits.

4. The asynchronous data pipeline as recited in claim 2, wherein each of the one or more control circuits is configured to de-assert its corresponding latch pulse after a predetermined delay subsequent to the latching of data into the present pipeline stage.

5. The asynchronous data pipeline as recited in claim 2, wherein each control circuit of the first plurality of pipeline stages is configured to enable assertion of the latch pulse responsive to receiving the first enable signal and wherein each control circuit of the second plurality of pipeline stages is configured to enable assertion of the latch pulse responsive to receiving the second enable signal.

6. The asynchronous data pipeline as recited in claim 1, wherein the control scan chain and the data scan chain are configured to operated independently of each other.

7. A method for testing an asynchronous data pipeline, the method comprising:
   scanning control data into a control scan chain of an asynchronous data pipeline and scanning test data into a data scan chain of the asynchronous data pipeline, wherein the asynchronous data pipeline includes a first and a second plurality of stages in an alternating sequence, wherein each of the stages includes:
      a control circuit,
      a latch circuit configured to latch data from a previous stage responsive to a pulse signal received from an output of the control circuit; and
      a combinational logic circuit coupled to receive data from an output of the latch circuit;
   wherein the control scan chain comprises a plurality of scannable keeper circuits each configured to hold a state of a signal line coupling corresponding adjacent ones of the control circuits, wherein control circuits of adjacent pipeline stages are coupled to communicate with each other over a single signal line;
   testing the control circuits of the asynchronous data pipeline, wherein testing the control circuits includes enabling selected ones of the control circuits and subsequently scanning out successor states;
   testing the latch circuits and combinational logic circuits of the asynchronous data pipeline comprising enabling selected ones of the control circuits and scanning out data from a latch circuits associated with the selected ones of the control circuits.

8. The method as recited in claim 7, wherein each control circuit of the first plurality of stages is coupled to receive a first enable signal, and wherein each control circuit of the second plurality of stages is coupled to receive a second enable signal.

9. The method as recited in claim 8, wherein testing the control circuits of the first and second plurality of pipeline stages comprises:
- de-asserting the first and second enable signals;
- scanning in control data into the control scan chain;
- providing control data into the control circuits of the first plurality of pipeline stages;
- asserting the first enable signal, wherein the control circuits of the first plurality are enabled responsive to said asserting the first enable signal;
- latching data through the latch circuits of the first plurality of pipeline stages;
- capturing successor states of the control circuits of the first plurality; and
- scanning out the successor states of the first plurality through the control scan chain.

10. The method as recited in claim 9 further comprising repeating said de-asserting and said scanning in control data, and wherein testing the control circuits further comprises:
- providing control data into the control circuits of the second plurality of pipeline stages;
- asserting the second enable signal, wherein the control circuits of the second plurality are enabled responsive to said asserting the first enable signal;
- latching data through the latch circuits of the second plurality of pipeline stages;
- capturing successor states of the control circuits of the second plurality; and
- scanning out the successor states of the second plurality through the control scan chain.

11. The method as recited in claim 10 further comprising repeating testing of the control circuits for a plurality of different control data patterns.

12. The method as recited in claim 8, wherein testing the latch and combinational circuits further comprises:
- scanning in a test data pattern through the data scan chain;
- scanning in control data through the control scan chain;
- enabling control circuits for at least one of the first and second pluralities of pipeline stages;
- latching data into corresponding pipeline stages responsive to said enabling;
- capturing data from the combinational logic circuits of the corresponding pipeline stages and;
- scanning out captured data through the data scan chain.

13. The method as recited in claim 12, further comprising enabling control circuits for both the first and second pluralities of pipeline stages.

14. The method as recited in claim 13 further comprising repeating testing the latch and combinational circuits for a plurality of data patterns.

15. The method as recited in claim 7, wherein one or more of the control circuits in the asynchronous data pipeline is coupled to receive:
- a request signal from a control circuit of a predecessor pipeline stage, the request signal indicating a request to latch data;
- an acknowledgment signal from a control circuit of a successor pipeline stage, the acknowledgement signal indicating that data has been latched in the successor pipeline stage;
- wherein each of the one or more control circuits is configured to assert the latch pulse responsive to concurrently receiving an asserted request signal and an asserted acknowledgement signal.

16. The method as recited in claim 7, wherein the control scan chain and the data scan chain are configured to operate independently of each other.

* * * * *